(12) United States Patent
Dekoker et al.

(10) Patent No.: US 11,018,626 B2
(45) Date of Patent: *May 25, 2021

(54) TEMPERATURE COMPENSATION FOR A VOLTAGE CONTROLLED OSCILLATOR

(71) Applicant: IXI Technology Holdings, Inc., Yorba Linda, CA (US)

(72) Inventors: Michael Dekoker, Huntington Beach, CA (US); Jeffrey Norris, Lake Forest, CA (US); Anthony Aquino, Brea, CA (US); Gary Carlson, Aliso Viejo, CA (US)

(73) Assignee: IXI Technology Holdings, Inc., Yorba Linda, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/880,737

(22) Filed: May 21, 2020

(65) Prior Publication Data

US 2020/0287504 A1 Sep. 10, 2020

Related U.S. Application Data

(63) Continuation of application No. 16/154,166, filed on Oct. 8, 2018, now Pat. No. 10,756,671.

(51) Int. Cl.
*H03B 5/04* (2006.01)
*H03M 1/66* (2006.01)
*H03M 1/12* (2006.01)

(52) U.S. Cl.
CPC .............. *H03B 5/04* (2013.01); *H03M 1/12* (2013.01); *H03M 1/66* (2013.01)

(58) Field of Classification Search
CPC .............. H03B 5/04; H03M 1/12; H03M 1/66
See application file for complete search history.

(56) References Cited

U.S. PATENT DOCUMENTS

2018/0006654 A1* 1/2018 Scott .................... H03L 1/02

* cited by examiner

*Primary Examiner* — Jeffrey M Shin
(74) *Attorney, Agent, or Firm* — The Watson IP Group, PLC; Jovan N. Jovanovic

(57) ABSTRACT

An apparatus that is comprised of a controller, a digital-to-analog converter (DAC), a temperature sensor, an analog-to-digital converter (ADC), and a voltage controlled oscillator (VCO). The controller to reads temperature data proportional to a temperature of the VCO, reads previously-calculated calibration data based on the read temperature data, determines a frequency command signal based on the read previously-calculated calibration data, and outputs the frequency command signal. The DAC converts the frequency command signal into a frequency analog signal. The temperature sensor produces the temperature signal. The ADC converts the temperature signal into the temperature data. The VCO produces an output frequency based on the frequency analog signal.

20 Claims, 3 Drawing Sheets

TEMPERATURE COMPENSATION FOR A VOLTAGE CONTROLLED OSCILLATOR

CROSS-REFERENCE TO RELATED APPLICATION

This application is a continuation of U.S. patent application Ser. No. 16/154,166, filed on Oct. 8, 2018 entitled "TEMPERATURE COMPENSATION FOR A VOLTAGE CONTROLLED OSCILLATOR", the entire disclosure of which is hereby incorporated by reference.

BACKGROUND OF THE DISCLOSURE

1. Field of the Disclosure

The disclosure relates in general to temperature compensation, and more particularly, to temperature compensation for a voltage controlled oscillator.

2. Background Art

In typical RF signal generation, accurate and repeatable frequency outputs are generated utilizing a voltage controlled oscillator (VCO). The VCO is an electrical component that, given a specific input voltage, instantaneously outputs a specific frequency. Many commercial off-the-shelf VCOs are sensitive to temperature changes such that, given a constant voltage input, their outputs will drift as the temperature changes, thereby introducing inaccuracy in the expected output frequency. Further, VCOs tend to be non-linear devices and require linearization for accurate frequency generation. Lastly, behavior of VCOs can vary from device to device, even if they are the same manufactured part.

SUMMARY OF THE DISCLOSURE

The disclosure is directed to an apparatus that is comprised of a controller, a digital-to-analog converter (DAC), a temperature sensor, an analog-to-digital converter (ADC), and a voltage controlled oscillator (VCO). The controller reads temperature data proportional to a temperature of the VCO, reads previously-calculated calibration data based on the read temperature data, determines a frequency command signal based on the read previously-calculated calibration data, and outputs the frequency command signal. The DAC converts the frequency command signal into a frequency analog signal. The temperature sensor produces the temperature signal. The ADC converts the temperature signal into the temperature data. The VCO produces an output frequency based on the frequency analog signal.

In some configurations, a scaling amplifier is coupled to an output of the DAC and an input of the VCO. The scaling amplifier adjusts the frequency analog signal to an appropriate voltage level for the VCO.

In some configurations, a memory is coupled to the controller, the memory storing the previously-calculated calibration data.

In some configurations, the controller is a micro-controller.

In some configurations, a power amplifier is coupled to an output of the VCO, the power amplifier amplifying the output of the VCO.

In some configurations, the controller further interpolates between two previously-calculated calibration data to determine the frequency command signal.

In some configurations, the previously-calculated calibration data is comprised of N+1 coefficients for an N-order polynomial that maps the output frequency of the VCO to an input voltage of the VCO.

In some configurations, the N-order polynomial is:

$$V=(c_0 \times F^N)+(c_1 \times F^{N-1})+(c_2 \times F^{N-2})+ \ldots +(c_N \times F^0);$$

where $c_i$ is the $i^{th}$ coefficient for a calibration point, F is the output frequency of the VCO, N is the order of the polynomial, and V is an input voltage of the VCO that results in the output frequency F of the VCO.

In some configurations, the previously-calculated calibration data is derived from a one-time calibration process that takes place after manufacture of the apparatus, with a temperature controlled environment being used to bring the apparatus through various operating temperatures of the apparatus to produce the previously-calculated calibration data.

The disclosure is also directed to a method comprising reading previously-calculated calibration data from a memory and outputting, from a controller, a frequency command signal based on the previously-calculated calibration data. The method further comprises converting the frequency command signal into a frequency analog signal and applying the frequency analog signal to a voltage controlled oscillator (VCO) to produce an output frequency. The method further comprises determining if the temperature of the VCO has changed beyond a threshold value and, subsequent to the determining, reading temperature data representing a current temperature of the VCO. The method further comprises, if the temperature of the VCO has changed beyond the threshold value, branching to the reading the previously-calculated calibration data and, if the temperature of the VCO has not changed beyond the threshold value, branching to the reading temperature data.

In some configurations, the reading of the temperature data is a second reading of the temperature data, the method further comprises, prior to the reading the previously-calculated calibration data from the memory, first reading temperature data representing the current temperature of the VCO.

In some configurations, the method further comprises adjusts the frequency analog signal to an appropriate voltage level for the VCO.

In some configurations, the previously-calculated calibration data of the method includes N+1 coefficients for an N-order polynomial that maps the output frequency of the VCO to an input voltage of the VCO.

In some configurations, the N-order polynomial of the method is:

$$V=(c_0 \times F^N)+(c_1 \times F^{N-1})+(c_2 \times F^{N-2})+ \ldots +(c_N \times F^0);$$

where $c_i$ is the $i^{th}$ coefficient for a calibration point, F is the output frequency of the VCO, and V is an input voltage of the VCO that results in the output frequency F of the VCO 110.

In some configurations, the method further comprises power amplifying an output of the VCO.

In some configurations, the method further comprises deriving the previously-calculated calibration data from a one-time calibration process by bringing the VCO through various operating temperatures to produce the previously-calculated calibration data.

In some configurations, the method further interpolates between two previously-calculated calibration data to determine the frequency command signal.

In some configurations, an apparatus executes the method.

BRIEF DESCRIPTION OF THE DRAWINGS

The disclosure will now be described with reference to the drawings wherein.

DETAILED DESCRIPTION OF THE DISCLOSURE

Figure 1:
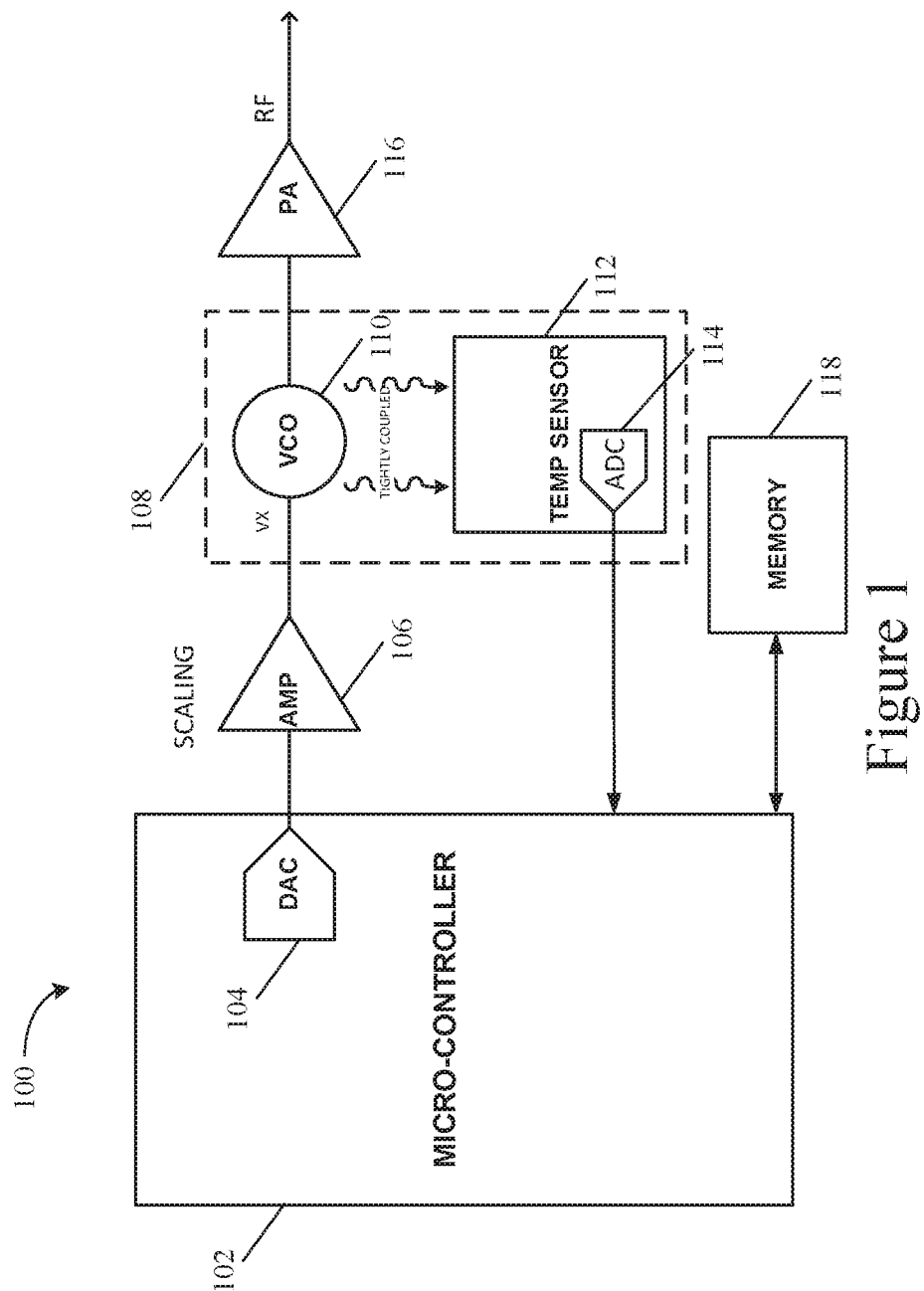
FIG. 1 illustrates an apparatus for compensating for temperature changes of a VCO, in accordance with the embodiments disclosed herein.

While this disclosure is susceptible of embodiment in many different forms, there is shown in the drawings and described herein in detail a specific embodiment(s) with the understanding that the present disclosure is to be considered as an exemplification and is not intended to be limited to the embodiment(s) illustrated.

It will be understood that like or analogous elements and/or components, referred to herein, may be identified throughout the drawings by like reference characters. In addition, it will be understood that the drawings are merely schematic representations of the embodiments, and some of the components may have been distorted from actual scale for purposes of pictorial clarity.

The embodiments described herein provide both an apparatus 100 and method 300 that compensate for inaccuracies of a typical VCO, such as in systems that use a VCO in an "open-loop" configuration. VCOs are used in open-loop configurations in many RF-based applications. There are reasons why a system designer might choose to use a VCO in an open-loop configuration, such as a) size constraints: extra circuitry required for using a phase-locked loop (PLL), b) speed: changing VCO frequencies can take a while for the PLL to "lock" onto the target frequency, c) complexity: designing associated PLL circuitry and programming the PLL can be complicated. The apparatus 100 uses curve fitting to model behavior of a VCO 110 at specific temperatures and then subsequently uses resulting polynomial coefficients to determine, in real time, appropriate input voltages for the VCO 110 for any desired valid output frequency, without being susceptible to temperature-induced frequency drift.

Referring now to the drawings and in particular to FIG. 1, an apparatus 100 is disclosed for compensating for temperature changes of a VCO 110, in accordance with the embodiments disclosed herein. The apparatus 100 includes a controller 102, such as micro-controller, coupled to an oscillator module 108. The controller 102 includes a digital-to-analog converter (DAC) 104. The oscillator module 108 includes the VCO 110 and a temperature sensor 112 which are tightly coupled together. In an embodiment, the controller 102 is coupled to the VCO 110 via a scaling amplifier 106, with the scaling amplifier 106 coupled to an output of the DAC 104 and an input of the VCO 110. The temperature sensor 112 includes an analog-to-digital converter (ADC) 114. In another embodiment, the ADC 114 is a discrete component from the temperature sensor 112. The controller 102 is further coupled to a memory 118.

During operation of the apparatus 100, the temperature sensor 112 senses the temperature of the VCO 110 and produces a temperature signal that is proportional to the sensed temperature of the VCO 110. The ADC 114 converts this temperature signal into the temperature data (digital data), the temperature data thus representing the temperature of the VCO 110. The memory 118 stores previously-calculated calibration data. The controller 102 reads the temperature data and reads the previously-calculated calibration data from the memory 118 based on the read temperature data. The controller 102 further outputs a frequency command signal (digital data) based on the read previously-calculated calibration data. The DAC 104 converts this frequency command signal into a frequency analog signal. The VCO 110 operates within a specific range of input voltage levels, by design. In an embodiment, the scaling amplifier 106 adjusts the output of the DAC 104 to an appropriate voltage level within this range of input voltage levels, that is appropriate for the VCO 110.

The VCO 110 produces a desired output frequency based on the adjusted version of the frequency analog signal produced by the scaling amplifier 106. Thereafter, the power amplifier 116 amplifies the output frequency to a desired level, the desired level being application specific.

The DAC 104 converts a frequency command signal produced by the controller 102 into a frequency analog signal. In another embodiment, the DAC 104 is a discrete component from the controller 102. The DAC 104 is coupled to a scaling amplifier 106. The scaling amplifier 106 adjusts the frequency analog signal to an appropriate voltage level for input to the VCO 110, with the VCO 110 receiving the adjusted signal produced by the scaling amplifier 106.

The apparatus 100 solves the problem of temperature-induced output frequency drift for the VCO 110 by generating a series of temperature-specific models such that, given a desired output frequency of the VCO 110 for a specific temperature, the models will generate the appropriate input voltage of the VCO 110. During runtime, the controller 102 can monitor the temperature of the VCO 110, e.g. via the temperature sensor 112. If this temperature has deviated beyond some specific application-defined threshold, then the appropriate model is read by the controller 102 from the memory 118 and applied to compensate for the output frequency drift of the VCO 110.

As an example, the VCO 110 has an input range of 0V to 3V and an output range of 2.25 GHz to 2.5 GHz at 25° C. Ideally, the relationship between the input of the VCO 110 and the output of the VCO 110 is perfectly linear. That is, an input of 0V would result in an output of 2.25 GHz and an input of 3V would result in an output of 2.5 GHz. Given this relationship, a general formula calculates the necessary input voltage for a given desired output frequency:

$$V_n = V_{min} + \left( \frac{F_n - F_{min}}{F_{max} - F_{min}} \times (V_{max} - V_{min}) \right) \qquad \text{(Eq. 1)}$$

Where:

$V_{min}$ and $V_{max}$ are the minimum and maximum VCO input voltages (e.g. 0 and 3V for our example);

$F_{min}$ and $F_{max}$ are the minimum and maximum VCO output frequencies (e.g. 2.25 GHz and 2.5 GHz for our example);

$F_n$ is the desired output frequency; and $V_n$ is the VCO input voltage that should be applied to the VCO that results in the output frequency $F_n$ of the VCO 110.

Further to this example, there is a desire to output a frequency of 2.404 GHz. Using Equation 1 above, an input of 1.848V is need for the VCO 110. However, in practice when an input of 1.848V is applied to the VCO 110, the output of the VCO 110 may be 2.404 GHz while a temperature of the VCO 110 is approximately 25° C. But, as the VCO 110 heats up (or cools down) that same input voltage results in a drifting output frequency. This is a problem for systems that need to generate an accurate frequency over a range of temperatures.

The apparatus 100 solves this drifting output frequency problem by alternatively determining the appropriate input voltage for a desired output frequency that takes a temperature of the VCO 110 into consideration. Instead of using Equation 1, the apparatus 100, and specifically the controller 102, uses the previously-calculated calibration data that allows modeling of behavior of the VCO 110 at a particular temperature. More specifically, this previously-calculated calibration data consists of N+1 coefficients for an N-order polynomial that maps a desired output frequency of the VCO 110 to an appropriate input voltage of the VCO 110. The order of the polynomial used is application specific and is selected based on characteristics of the particular VCO 110.

As an example, the VCO 110 has been previously calibrated and $4^{th}$ order polynomials are used for the apparatus 100. Further, a temperature of the VCO 110 is 37° C. and has changed enough that compensation for the temperature change is needed. The controller 102 access the memory 118 that stores a lookup table, such as that being previously established by a one-time calibration process described below in FIG. 2, to read the calibration data for 37° C. The controller 102 reads 5 coefficients (1+ polynomial order):

515.4323317, −5176.97395, 19486.80889, −32561.62891, and 20371.32458

Given these coefficients, the controller 102 calculates the appropriate input voltage for the VCO 110 for any valid output frequency (at 37° C.) by evaluating the polynomial:

$$V=(c_0 \times F^N)+(c_1 \times F^{N-1})+(c_2 \times F^{N-2})+ \ldots +(c_N \times F^0) \quad \text{(Eq. 2)}$$

Where:
$c_i$ is the $i^{th}$ coefficient for the calibration point;
F is the desired output frequency in GHz; and
V is the input voltage of the VCO 110 that results in the desired output frequency F of the VCO 110.

Further to the example above, to generate an output frequency of 2.404 GHz a calculation is performed by the controller 110 as follows:

$$V_{2.404}=(515.4323317 \times 2.404^4)+(-5176.97395 \times 2.404^3)+(19486.80889 \times 2.404^2)+(-32561.62891 \times 2.404^1)+(20371.32458 \times 2.404^0)$$

With $V_{2.404}$=1.828.

For the particular VCO 110 of this example at 37° C., if the desired output frequency is 2.404 GHz then the input voltage of 1.828V is to be applied to the VCO 110. This input voltage of the VCO 110 is somewhat close to the 1.848V calculated by the idealized linear Equation 1 above, with the disparity being due to a sensitivity of the VCO 110 to higher temperature(s).

To further increase accuracy of the apparatus 100 when a current temperature falls between two calibration points, linear interpolation between the two calibrated voltages is used. For example, suppose that the temperature sensor 112 senses that the VCO 110 is at 37.875° C. and the desired output frequency of the VCO 110 is 2.404 GHz. From the description above, at 37° C. the input of the VCO 110 is 1.828V. Further, using Equation 2 with the calibration data for 38° C. (omitted here for brevity) the calculated input of the VCO 110 is 1.833V. The controller 102 performs linear interpolation between these two values to obtain the input voltage for 37.875° C.:

$$V_{2.404}=((1-0.875) \times 1.828)+(0.875 \times 1.833)=1.832$$

Using this scheme, the apparatus 100 can be as accurate as needed in terms of the desired output frequency of the VCO 110 by tuning calibration resolution (e.g. calibrate every N degrees C.), update frequency (e.g. compensate for temperature whenever it's changed M degrees C.), and a temperature polling frequency of the VCO 110.

In an example embodiment, the calibration data itself is derived from a one-time calibration process. In an example, this calibration process can be performed at the factory where the VCO 110 is manufactured. During the calibration process, a temperature controlled environment is used to bring the apparatus 100 through all potential operating temperatures. At each calibration temperature as reported by the temperature sensor 112 of the oscillator module 108, the following steps are performed:

1. A specific, known voltage is input to the VCO 110;
2. The resulting output frequency is measured using a calibrated spectrum analyzer (not shown);
3. Steps 1 and 2 are performed for 32 different voltages spanning an operating range of the VCO 110;
4. These 32 voltage/frequency pairs are run through an N-order polynomial curve fit algorithm that generates the N+1 coefficients; and
5. The N+1 coefficients (i.e. the calibration data) are stored in the memory 118 such that the controller 102 can read them during normal runtime operation of the apparatus 100.

The amount of storage within the memory 118 required for the calibration data is a function of calibration resolution, polynomial order, and underlying coefficient data type. For example, calibrating the apparatus 100 from 15 to 70° C. in one degree increments, using fourth order polynomials and 8-byte double-precision floating point coefficients, the amount of storage needed within the memory 118 is ((70−15+1)×(4+1)×8)=2,240 bytes. Such small number of bytes for storage within the memory 118 allows for use of a small memory 118, which minimizes the expense of manufacturing the apparatus 100. Further, as this calibration data is immutable it can be stored in the memory 118, which can be a read-only memory (ROM), such as an Electrically Erasable Programmable ROM (EEPROM).

Figure 2:
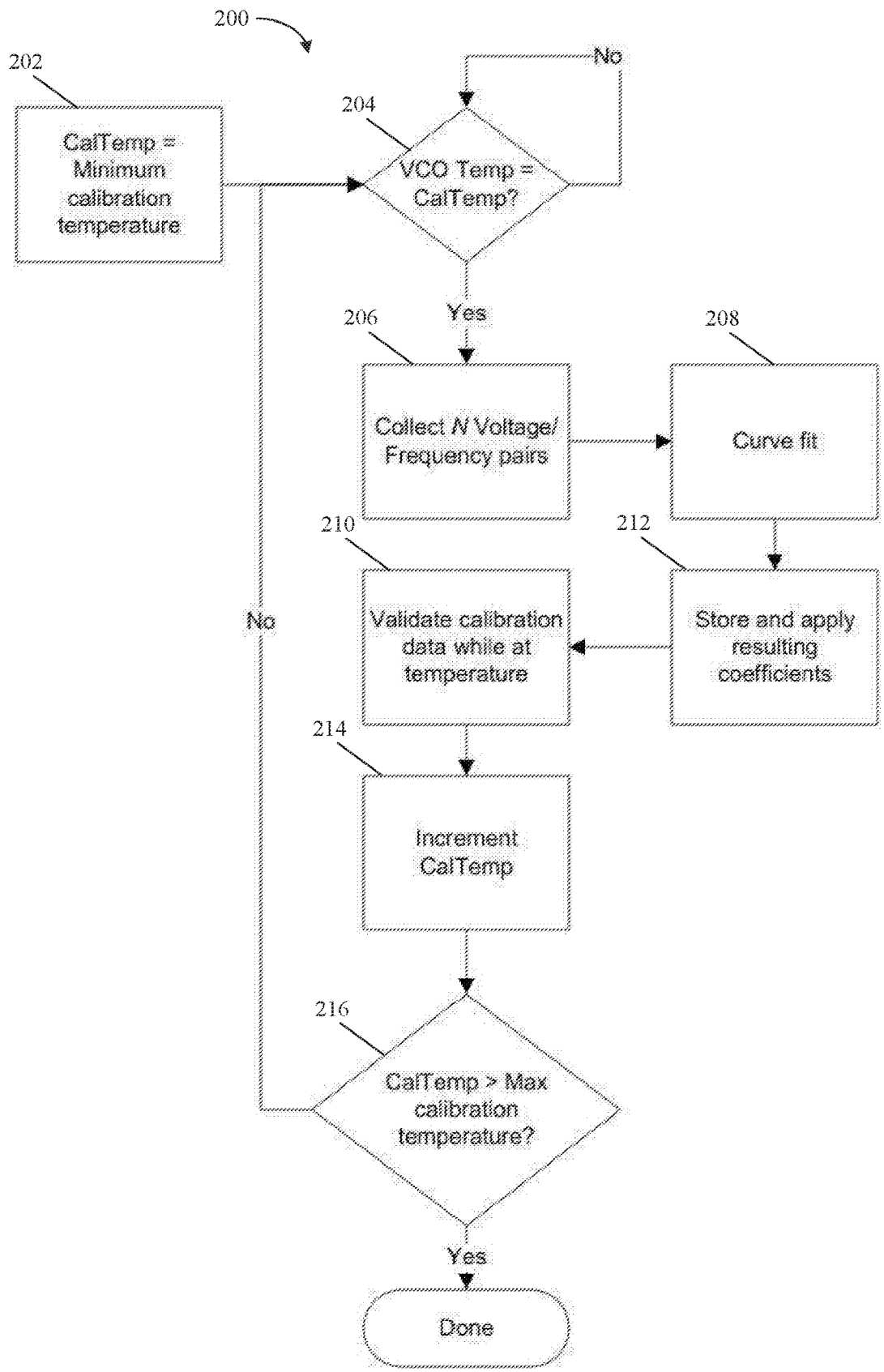
FIG. 2 illustrates a flowchart for an example method of initially calibrating the apparatus of FIG. 1, in accordance with the embodiments disclosed herein.

FIG. 2 illustrates a flowchart for an example method 200 of initially calibrating the apparatus 100 of FIG. 1, in accordance with the embodiments disclosed herein. In an example, the apparatus 100 executes the method 200. For the method 200, the apparatus 100 is placed within a temperature controlled environment. In block 202, a calibration temperature (CalTemp) of the VCO 110 within the temperature controlled environment is set at a minimum calibration temperature, such as a minimum potential temperature that the oscillator module 108 is to be operated within. In block 204, the temperature sensor 112 senses the current temperature of the VCO 110 and the CalTemp from block 202 is compared, by the controller 102, to the current temperature of the VCO 110. If the current temperature of the VCO 110 as sensed by the temperature sensor 112 is not equal to the CalTemp, block 202 repeats to continue to determine if the current temperature of the VCO 110 is equal to the Cal Temp. If the current temperature of the VCO 110 as sensed by the temperature sensor 112 is equal to the CalTemp, block 204 branches to block 206.

At block 206, the controller 102 collects N voltage/frequency pairs, such as discussed above. Block 206 proceeds to block 208. At block 208, the controller 102 applies curve fitting to generate the N+1 coefficients, as discussed above. Block 208 proceeds to block 212. At block 212, the controller 102 stores in the memory 118 the N+1 coefficients and applies these coefficients to produce the frequency analog signal discussed above. Block 212 proceeds to block 210. At block 210, the desired output frequency of the VCO 110 is validated while at a current temperature. For example, the calibrated spectrum analyzer can be used to measure the desired output frequency of the VCO 110 while at a current temperature, as a basis for validating if the coefficients applied in block 212 produce the desired output frequency of the VCO 110 while at a current temperature. Block 210 proceeds to block 214.

At block 214, the current temperature within the temperature controlled environment is incremented. For example, the CalTemp is incrementally increased. Block 214 proceeds to block 216. At block 216, the controller 102 determines if the incremented CalTemp from block 216 is greater than a maximum calibration temperature, such as a maximum potential temperature that the oscillator module 108 is to be operated within. If the controller 102 determines in block 216 that the CalTemp is greater than the maximum calibration temperature, the method 200 ends. Otherwise, if the controller 102 determines in block 216 that the CalTemp is not greater than the maximum calibration temperature, block 216 branches to block 204 for the controller 102 to continue to collect additional N voltage/frequency pairs.

Figure 3:
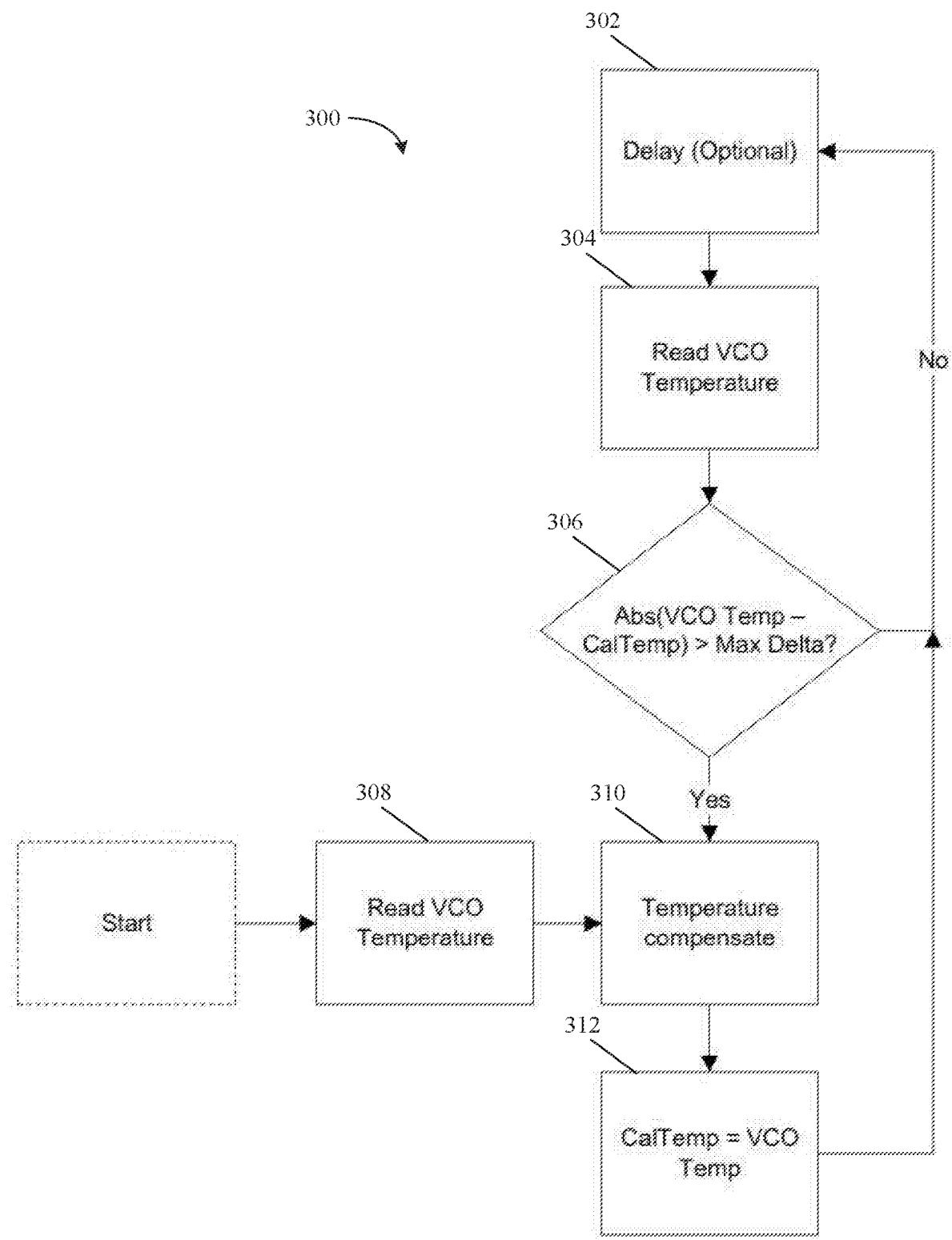
FIG. 3 illustrates a flowchart for an example method of operation of the apparatus of FIG. 1, in accordance with the embodiments disclosed herein.

FIG. 3 illustrates a flowchart for an example method 300 of operation of the apparatus 100 of FIG. 1, in accordance with the embodiments disclosed herein. In an example, the apparatus 100 executes the method 300. In block 308, the temperature of the VCO 110 is read. For example, the temperature sensor 112 produces a temperature signal that is proportional to a temperature of the VCO 110 and the ADC 114 converts this temperature signal into the temperature data. The controller 102 reads this temperature data in block 308. Block 308 proceeds to block 310.

At block 310, temperature compensation is performed. For example, the controller 102 reads the previously-calculated calibration data discussed above from the memory 118. The controller 102 determines the frequency command signal based on the read previously-calculated calibration data. The controller 102 outputs the frequency command signal. The DAC 104 converts this frequency command signal into a frequency analog signal. The VCO 110 operates within a range of input voltage levels by design. In an embodiment, the scaling amplifier 106 adjusts the output of the DAC 104 to an appropriate voltage level within this range of input voltage levels, that is appropriate for the VCO 110. The scaling amplifier 106 applies the adjusted frequency analog signal to the VCO 110. The VCO 110 produces a desired output frequency based on the adjusted version of the frequency analog signal produced by the scaling amplifier 106. Branch 310 proceeds to block 312.

At block 312, the CalTemp is set to be equal to the current temperature of the VCO 110. In an example, the controller 102 sets the CalTemp to be equal to the current temperature of the VCO 110. Block 312 proceeds to block 302. At block 302, a delay is added to the method 300. In an embodiment, this delay is optional. Block 302 proceeds to block 304. At block 304, the temperature sensor 112 senses the current temperature of the VCO 110. For example, the temperature sensor 112 produces a temperature signal that is proportional to a temperature of the VCO 110 and the ADC 114 converts this temperature signal into the temperature data. The controller 102 reads this temperature data in block 304. Block 304 proceeds to block 306.

At block 306, a determination is made if the temperature of the VCO 110 has changed beyond a threshold value. The temperature of the VCO 100 that is read in block 304 is subtracted from the CalTemp from block 312, and an absolute value of this difference is determined. The absolute value of the difference is compared to a maximum difference value, Max Delta. In an example, the controller 102 performs this subtraction, determines the absolute value of this difference, and compares the difference between the absolute value and the Max Delta. If this comparison is greater than the Max Delta, block 306 branches to block 310. If this comparison is not greater than the Max Delta, block 306 branches to block 302.

The foregoing description merely explains and illustrates the disclosure and the disclosure is not limited thereto except insofar as the appended claims are so limited, as those skilled in the art who have the disclosure before them will be able to make modifications without departing from the scope of the disclosure.

What is claimed is:

1. An apparatus, comprising:
   a controller to read temperature data proportional to a temperature of a voltage controlled oscillator (VCO) in an open-loop configuration, read previously-calculated calibration data based on the read temperature data, determine a frequency command signal based on the read previously-calculated calibration data, and output the frequency command signal;
   a digital-to-analog converter (DAC) to convert the frequency command signal into a frequency analog signal and to apply the frequency analog signal to the VCO to produce the output frequency;
   a temperature sensor to produce the temperature signal; and
   an analog-to-digital converter (ADC) to convert the temperature signal into the temperature data;
   wherein the VCO produces an output frequency based on the frequency analog signal.

2. The apparatus of claim 1, further comprising a scaling amplifier, coupled to an output of the DAC and an input of the VCO, to adjust the frequency analog signal to an appropriate voltage level for the VCO.

3. The apparatus of claim 1, further comprising a memory coupled to the controller to store the previously-calculated calibration data.

4. The apparatus of claim 1, wherein the controller is a micro-controller.

5. The apparatus of claim 1, further comprising a power amplifier, coupled to an output of the VCO, to amplify the output of the VCO.

6. The apparatus of claim 5, wherein the controller further interpolates between two previously-calculated calibration data to determine the frequency command signal.

7. The apparatus of claim 1, wherein the previously-calculated calibration data is comprised of N+1 coefficients for an N-order polynomial that maps the output frequency of the VCO to an input voltage of the VCO.

8. The apparatus of claim 7, wherein the N-order polynomial is:

$$V=(c_0 \times F^N)+(c_1 \times F^{N-1})+(c_2 \times F^{N-2})+ \ldots +(c_N \times F^0);$$

where $c_i$ is the $i^{th}$ coefficient for a calibration point, F is the output frequency of the VCO, and V is an input voltage of the VCO that results in the output frequency F of the VCO.

9. The apparatus of claim 1, wherein the previously-calculated calibration data is derived from a one-time calibration process that takes place after manufacture of the apparatus, with a temperature controlled environment being used to bring the apparatus through various operating temperatures of the apparatus to produce the previously-calculated calibration data.

10. The apparatus of claim 1, wherein the DAC applies the frequency command signal directly to the VCO to produce the output frequency.

11. A method, comprising
reading, by a controller, previously-calculated calibration data from a memory;
determining, by the controller, a frequency command signal based on the read previously-calculated calibration data;
outputting, by the controller, the frequency command signal;
converting, by a digital-to-analog converter (DAC), the frequency command signal into a frequency analog signal;
applying, by the DAC, the frequency analog signal to a voltage controlled oscillator (VCO) to produce an output frequency, the VCO being in an open-loop configuration;
determining if the temperature of the VCO has changed beyond a threshold value;
subsequent to the determining, reading temperature data representing a current temperature of the VCO;
if the temperature of the VCO has changed beyond the threshold value, branching to the reading the previously-calculated calibration data; and
if the temperature of the VCO has not changed beyond the threshold value, branching to the reading temperature data.

12. The method of claim 11, wherein the reading temperature data is a second read of the temperature data, the method further comprising, prior to the reading the previously-calculated calibration data from the memory, first reading temperature data representing the current temperature of the VCO.

13. The method of claim 11, further comprising adjusting the frequency analog signal to an appropriate voltage level for the VCO.

14. The method of claim 11, wherein the previously-calculated calibration data includes N+1 coefficients for an N-order polynomial that maps the output frequency of the VCO to an input voltage of the VCO.

15. The method of claim 14, wherein the N-order polynomial is:

$$V = (c_0 \times F^N) + (c_1 \times F^{N-1}) + (c_2 \times F^{N-2}) + \ldots + (c_N \times F^0);$$

where $c_i$ is the $i^{th}$ coefficient for a calibration point, F is the output frequency of the VCO, and V is an input voltage of the VCO that results in the output frequency F of the VCO.

16. The method of claim 11, further comprising power amplifying an output of the VCO.

17. The method of claim 11, further comprising adding a delay prior to the second reading the temperature data.

18. The method of claim 11, further comprising deriving the previously-calculated calibration data from a one-time calibration process by bringing the VCO through various operating temperatures to produce the previously-calculated calibration data.

19. The method of claim 11, further comprising interpolating between two previously-calculated calibration data to determine the frequency command signal.

20. An apparatus to execute the method of claim 11.

* * * * *